United States Patent
Nakai et al.

(10) Patent No.: US 6,246,590 B1
(45) Date of Patent: Jun. 12, 2001

(54) SUBSTRATE JUNCTION ELEMENT

(75) Inventors: Takashi Nakai; Katsumi Ito, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/441,590

(22) Filed: Nov. 17, 1999

(30) Foreign Application Priority Data

Dec. 9, 1998 (JP) .................................................. 10-349793

(51) Int. Cl.⁷ .............................. H05K 1/14; H01R 12/02
(52) U.S. Cl. ...................... 361/803; 361/767; 361/784; 174/52.1; 360/97.01
(58) Field of Search .................................... 361/748, 749, 361/760, 767, 777, 784, 792, 803, 807, 808; 174/52.1; 360/97.01, 98.01

(56) References Cited

U.S. PATENT DOCUMENTS 4,823,217   4/1989   Kato et al. .
5,541,788 * 7/1996   Ishida et al. ...................... 360/98.01
5,583,720 * 12/1996  Ishida et al. ...................... 360/97.01
5,597,496 * 1/1997   Masaichi et al. ...................... 216/94

* cited by examiner

Primary Examiner—Jayprakash N. Gandhi
(74) Attorney, Agent, or Firm—Brinks Hofer Gilson & Lione

(57) ABSTRACT

In a substrate junction element for reliably connecting the substrates used in a magnetic disk device, wiring substrates electrically connected to the magnetic head are placed on a carriage, and then a main substrate composed of a thin-film substrate and a reinforcing plate is placed on the wiring substrates, whereby it is possible to prevent the wiring substrates from rising. Further, by superimposing the thin-film substrate extending from the main substrate on the wiring substrates, it is possible to prevent generation of a difference in height in the soldering portion.

7 Claims, 4 Drawing Sheets

SUBSTRATE JUNCTION ELEMENT

BACKGROUND OF THE INVENTION

1. Field of the Invention

The present invention relates to a junction element for connecting wirings used in an electronic apparatus such as a magnetic disc apparatus, an optical disc apparatus or a magneto-optical disc apparatus and, in particular, to a substrate junction element capable of reliably connecting substrates differing in thickness.

2. Description of the Related Art

FIG. 5 is a partial perspective view showing a wiring junction process for a magnetic head device provided in a conventional floppy disk apparatus, and FIG. 6 is a partial perspective view showing the construction after the connection of the wiring.

In a magnetic head device for a floppy disk apparatus, magnetic heads are symmetrically opposed to each other with the disk serving as the magnetic medium being therebetween. The magnetic head positioned above the disk is supported by a gimbal, and the magnetic head positioned below the disk is supported by a plate.

Each magnetic head is connected to a wiring substrate, which extends over a carriage 1 positioned at the rear end of the magnetic head device.

In FIG. 5, numeral 2 indicates the wiring substrate connected to the magnetic head positioned below the disk, and numeral 3 indicates the wiring substrate connected to the magnetic head positioned above the disk. On the wiring substrates 2 and 3, conductive leads connected to electrode portions of the magnetic heads are formed, and these conductive leads are connected to connection land portions 2a and 3a at the rear end of the wiring substrates 2 and 3. Further, as shown in FIG. 5, the wiring substrates 2 and 3 have holes 2b and 3b formed in the vicinity of the connection land portions 2a and 3a.

Further, a main substrate 4 is installed on the carriage 1. This main substrate 4 comprises a thin-film substrate 5 on which predetermined electronic parts constituting recording/reproduction circuits, etc. are mounted, and a reinforcing plate 6 joined to the back side thereof and having a fixed thickness. Formed on the thin-film substrate 5 is a conductive lead connected to the electrode portions of the electronic parts, and a part of the conductive lead extends to the forward end of the thin-film substrate 5 and is connected to connection land portions 5a.

As shown in FIG. 5, a protrusion 1a is formed on the carriage 1, and the protrusion 1a is passed through a hole 4a formed in the main substrate 4, whereby the positioning of the main substrate 4 on the carriage 1 is effected.

Further, the protrusion la is passed through the holes 2b and 3b formed in the wiring substrates 2 and 3, which are placed on the main substrate 4, whereby the connection land portions 2a and 3a of the wiring substrates 2 and 3 are partly superimposed on the connection land portion 5a of the main substrate 4.

Then, as shown in FIG. 6. the connection land portions 2a and 3a of the upwardly exposed wiring substrates 2 and 3 and the connection land portion 5a of the main substrate 4 are soldered (shaded portion) to thereby effect conductive connection.

However, in the construction in which the main substrate 4 is arranged on the carriage 1 and then the wiring substrates 2 and 3 are placed thereon to solder the connection land portions 2a and 3a of the wiring substrates 2 and 3 to the connection land portions 5a of the main substrate 4, the connection land portions 2a and 3a are apt to rise from the connection land portions 5a of the main substrate 4 due to warpage, etc. of the wiring substrates 2 and 3.

Thus, it is necessary to solder the connection land portions 2a and 3a to the connection land portions 5a while pressing the wiring substrates 2 and 3 to the surface of the main substrate 4 by using a tool such as a pair of tweezers, with the result that the soldering operation is very difficult. Further, when the wiring substrates 2 and 3 rise during or immediately after the soldering operation, the solder between the connection land portions is broken or separated, with the result that defective soldering,.is likely to occur.

SUMMARY OF THE INVENTION

The present invention has been made for the purpose of solving the above problem in the conventional technique. Accordingly, it is an object of the present invention to provide a substrate junction element in which rising of the wiring substrate due to warpage or the like is prevented, thereby making it possible to reliably solder the connection land portions of the main substrate and the wiring substrates.

In accordance with the present invention, there is provided a substrate junction element comprising a main substrate having on its surface a wiring portion on which electronic parts are mounted and in its edge portion a connection land portion, a flexible wiring substrate having a connection land portion connected to the main substrate and a conductive lead connected to the connection land portion and adapted to connect the electronic parts to other electronic function portions, and a relay member having a support surface supporting the connecting portion of the main substrate and the wiring substrate, wherein the wiring substrate is installed on the support surface, wherein the main substrate is placed on the wiring substrate so that the connection land portion of the main substrate is adjacent thereto, and wherein connection land portion of the wiring substrate and the connection land portion of the main substrate are soldered to each other.

Further, it is desirable that a positioning portion be formed on the support surface which is fitted into the wiring substrate to effect the positioning of the wiring substrate.

When there are a plurality of wiring substrates, it is desirable that the positioning of each wiring substrate be effected by the common positioning portion, and that the main substrate be placed on the plurality of wiring substrates.

In the present invention, an end portion of a wiring substrate which connects an electronic part to an electronic function portion and which has a smaller width and is longer than a main substrate is installed on a support surface, and a relatively wide main substrate on which the electronic part is mounted is placed on the wiring substrate to be superimposed thereon. Thus, the end portion of the wiring substrate where the connection land portion is formed does not rise from the support surface. In particular, the connection land portions of the wiring substrate and the main substrate can be reliably soldered to each other without having to press the wiring substrate against the main substrate.

The positioning portion is a protrusion provided on the relay member, and a recess or a hole into which the protrusion is to be fitted are formed in the wiring substrate and the main substrate. By effecting positioning by using this positioning portion, the positioning of the connection land portions of the two substrates can be effected such that soldering can be conducted.

In particular, the main substrate consists of a laminate which comprises a thin-film substrate on which electronic parts are mounted and on which a connection land portion is formed, and a reinforcing plate supporting this thin-film substrate. It is desirable that the thin-film substrate protrude beyond the edge portion of the reinforcing plate, and that this protruding thin-film substrate be placed on the wiring substrate on the support surface.

In this case, the relay member can be provided with a step portion forming a portion lower than the support surface, the portion of the main substrate having the reinforcing plate being positioned at the lower portion, and the thin-film substrate protruding from the edge portion of the reinforcing plate being placed on the support surface.

Further, it is desirable that the reinforcing plate and the relay member being fastened by adhesion to each other in the lower portion.

In the above-mentioned means, the thin-film substrate extending from the thick main substrate is superimposed on the thin-film wiring substrate, so that no great difference in height is generated due to the difference in substrate thickness in the joint portion of the wiring substrate and the main substrate. Thus, it is possible to reliably solder the connection land portions to each other.

Further, in the present invention, it is only necessary to superimpose on the support surface the wiring substrate and the thin-film substrate extending from the main substrate, so that it is possible not to provide the step portion in the relay member and to provide the reinforcing plate (thick portion) at a position deviated from the support surface.

Further, the adhesion and fastening in the lower portion formed in the step portion is effected by an anaerobic type adhesive, a thermosetting type adhesive, an UV setting type adhesive, an adhesive double coated tape or the like. By this fastening by adhesion, the main substrate can be provided on the relay member in a stable manner.

In an example, the relay member is a carriage to which the base end of the support member supporting the magnetic head is fastened, and a circuit for recording and reproduction is mounted on the main substrate, the wiring substrate connecting the electronic parts on the main substrate to the magnetic head as the electronic function portion.

In the substrate junction element of the present invention, the electronic function portion is not restricted to a magnetic head. It also may be one in which the wiring substrate is connected to an optical head or the like or one in which it is connected to some other electronic circuit.

DESCRIPTION OF THE PREFERRED EMBODIMENT

Figure 1:
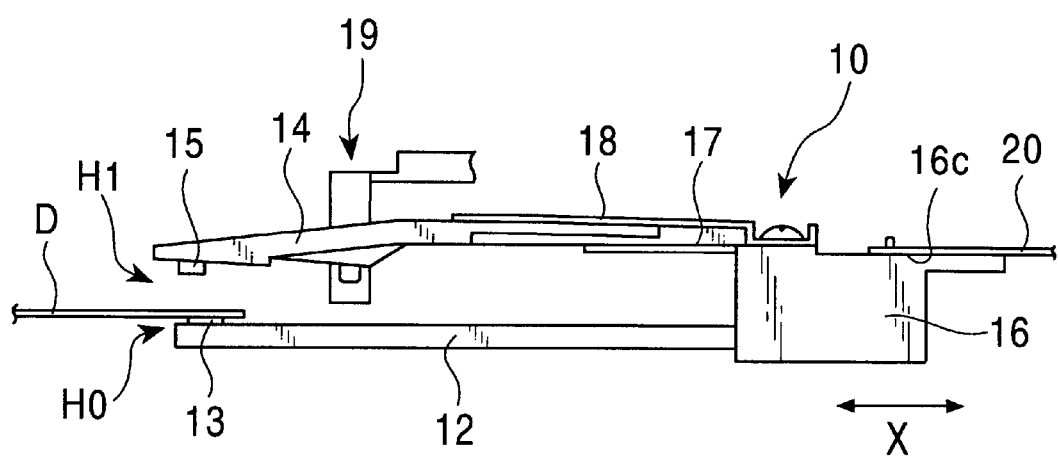
FIG. 1 is a partial side view showing a head unit for a floppy disk apparatus as an example of an apparatus using the substrate junction element of the present invention.
Figure 2:
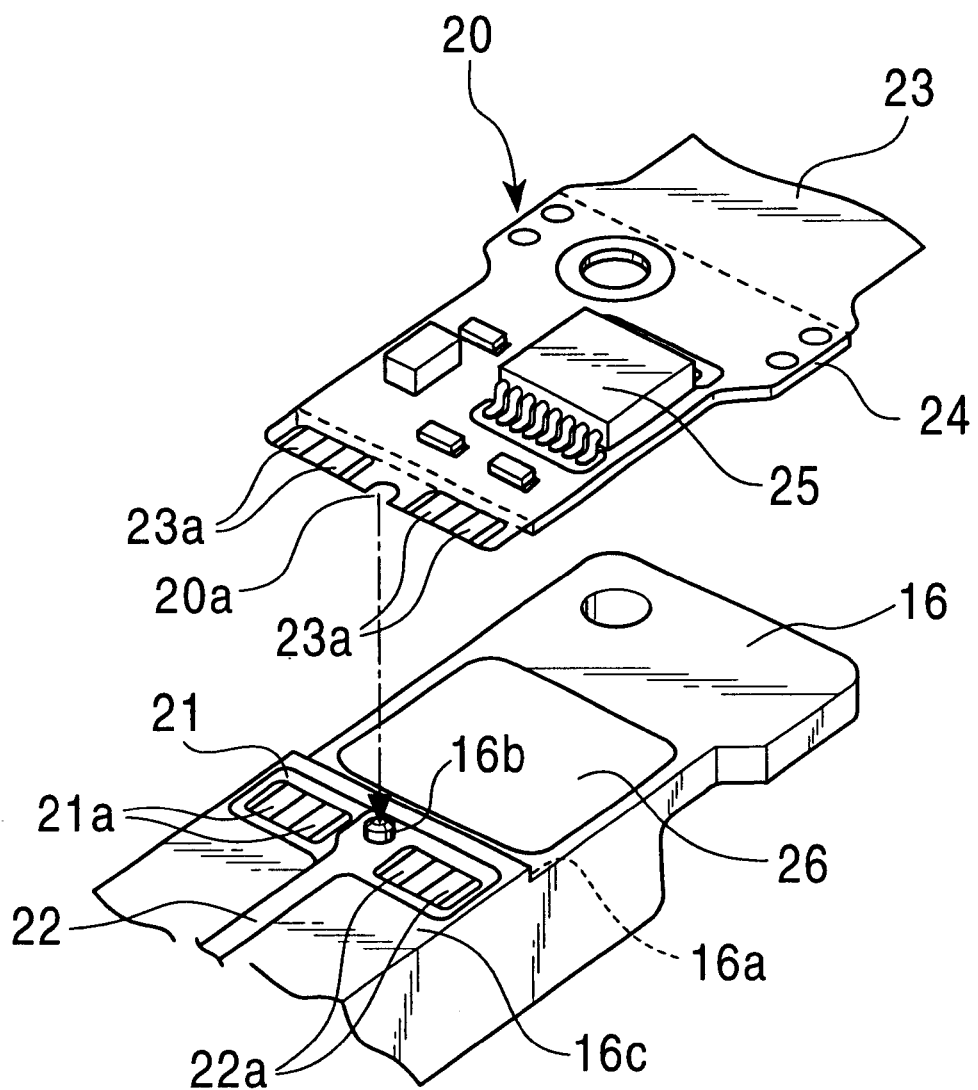
FIG. 2 is a partial perspective view showing an assembly process of the magnetic head device shown in FIG. 1.
Figure 3:
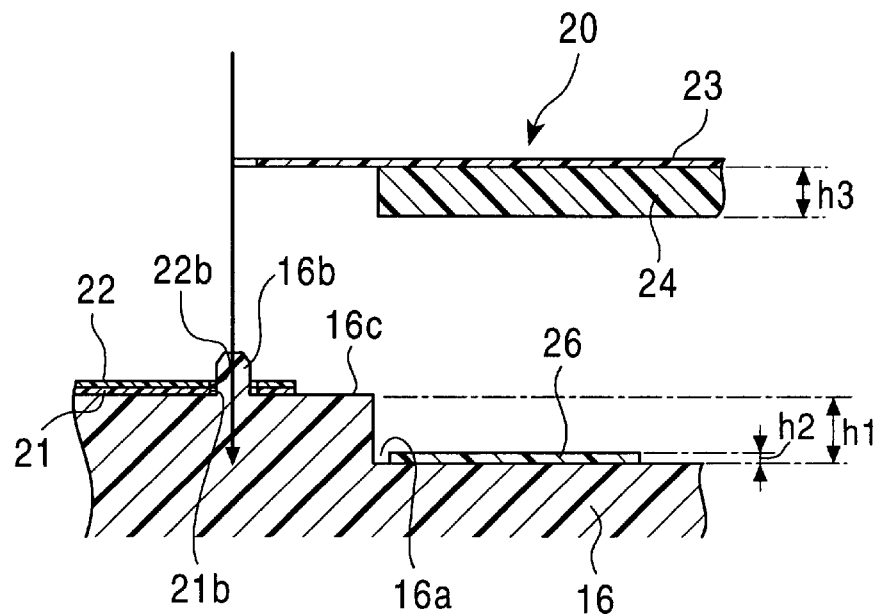
FIG. 3 is a partial sectional view of FIG. 2.
Figure 4:
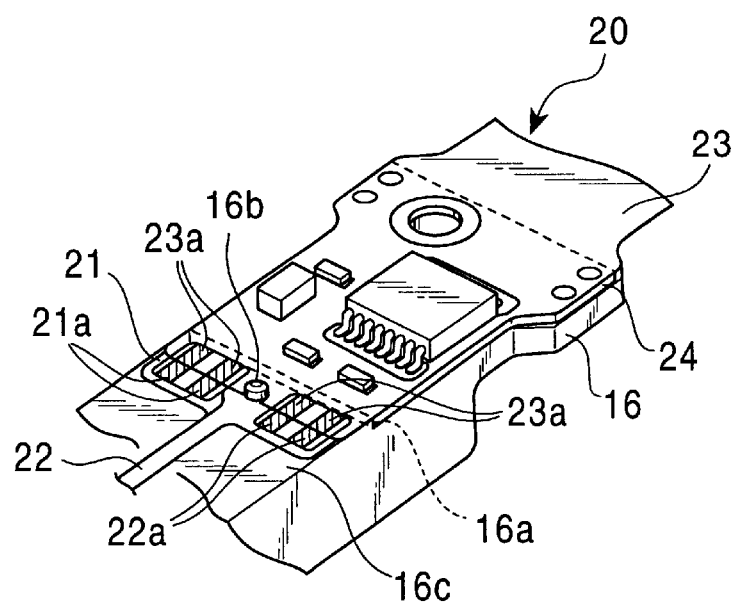
FIG. 4 is a partial perspective view showing the construction of the magnetic head device after the completion of assembly.
Figure 5:
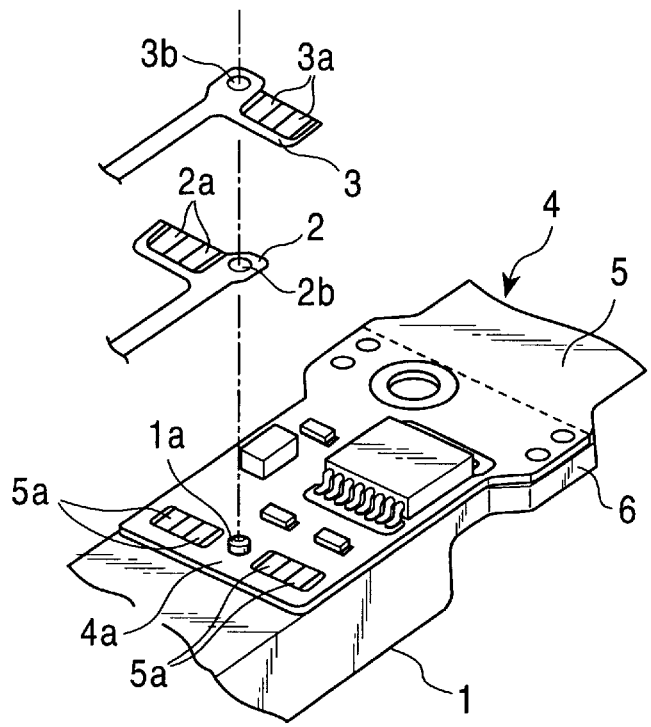
FIG. 5 is a partial perspective view showing the joining process for a wiring junction element of a conventional magnetic head device.
Figure 6:
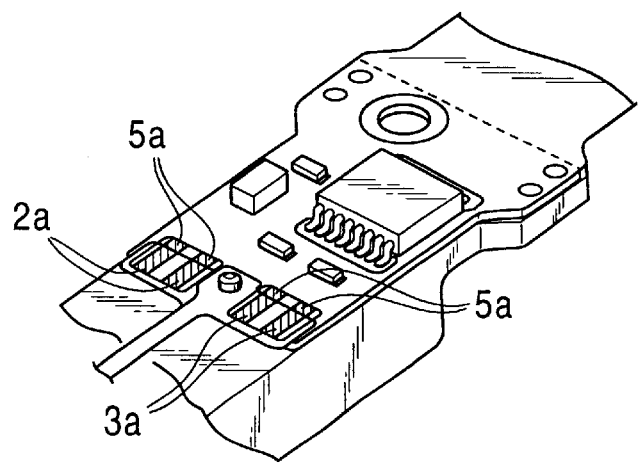
FIG. 6 is a partial perspective view showing the junction state of a conventional junction element.

FIG. 1 is a partial side view showing a magnetic head device mounted in a floppy disk apparatus as an example of an apparatus using the substrate junction element of the present invention; FIG. 2 is a partial perspective view showing an assembly process of the magnetic head device shown in FIG. 1; FIG. 3 is a partial sectional view of FIG. 2; and FIG. 4 is a partial perspective view showing the construction of the magnetic head device after the completion of assembly.

The magnetic head device 10 shown in FIG. 1 is supported so as to be movable to the right and left (in the X-direction) by a guide shaft (not shown), and is driven to the right and left (in the X-direction) by a linear drive mechanism or a stepping drive mechanism (not shown). The magnetic head device 10 is moved in a radial direction of a disk D, which serves as the magnetic medium.

As shown in FIG. 1, the magnetic head device 10 is equipped with a lower holder (support member) 12, and an H0 side magnetic head 13 is provided in the forward portion of the lower holder 12. An upper holder (support member) 14 is provided above the lower holder 12. At the forward end of this upper holder, an H1 side magnetic head 15 is provided.

As shown in FIG. 1, a carriage 16 is provided at the rear end of the lower holder 12 and the upper holder 14, and the upper holder 14 is joined to the carriage 16 through the intermediation of a plate spring 17. Further, the upper holder 14 is capable of rotating vertically above the lower holder 12 through elastic deformation of the plate spring 17.

Further, on the upper holder 14, there is provided a spring 18 which extends to the carriage 16. By this spring 18, the upper holder 14 is biased downwardly as seen in the drawing. Due to this biasing force, the disk D is held between a magnetic head 15 provided at the forward end of the upper holder 14 and a magnetic head provided at the forward end of the magnetic head 13. Further, when the upper holder 14 is raised by a retraction mechanism 19, the holding of the disk D by the magnetic heads 13 and 15 is canceled. On the surfaces of the magnetic heads 13 and 15 facing the disk D, there are provided a recording/reproducing gap and an erasing gap.

As shown in FIG. 1, the carriage 16 provided at the rear end of the magnetic head device 10 is equipped with a main substrate 20 extending from further backward than the carriage 16.

Further, the electrode portions (not shown) of the magnetic heads 13 and 15 serving as the electronic functioning portions provided at the forward end of the lower holder 12 and the upper holder 14 are electrically connected to wiring substrates 21 and 22 shown in FIG. 2, etc., and these wiring substrates 21 and 22 extend over the carriage 16. The carriage 16 is used as a relay member, whose upper surface constitutes a support surface 16c, the wiring substrates 21 and 22 being connected to the main substrate 20 by the support surface 16c.

Next, the construction of the wiring junction element formed by the wiring substrates 21 and 22 and the main substrate 20 will be described.

Each of the wiring substrates 21 and 22 is a flexible substrate formed by forming a conductive lead on an insulating film, and covering the conductive lead with a resist layer. These wiring substrates are smaller in width as compared with the main substrate 20, and extend along the lower holder 21 and the upper holder 14 shown in FIG. 1. The conductive leads formed on the wiring substrates 21 and 22 are electrically connected to the electrode portions of the magnetic heads 13 and 15, and, further, connection land portions 21a and 22a (See FIG. 2) are formed at the rear end of the wiring substrates 21 and 22 so as to be exposed.

As shown in FIG. 2, the main substrate 20 comprises a thin-film substrate 23 and a reinforcing plate 24 joined to the back side thereof. Electronic parts, such as a read write IC 25, are mounted on the thin-film substrate 23, and a conductive lead (not shown) is electrically connected to the electrode portion of each electronic part, and a part of it is connected to a connection land portion 23a in the forward end edge portion of the thin-film substrate 23.

In the main substrate 20, the forward portion of the thin-film substrate 23, that is, the portion where the connection land portion 23a is formed protrudes forwardly from the reinforcing plate 24, the protruding portion of the thin-film substrate 23 constituting the thin portion of the main substrate 20.

Next, the method of joining the main substrate to the wiring substrates 21 and 22 on the support surface 16c of the carriage 16 serving as the relay member will be described with reference to FIGS. 2 and 3.

As shown in FIGS. 2 and 3, first, the wiring substrate 21 electrically connected to the magnetic head 13 (See FIG. 1) on the H0 side is placed on the support surface 16c in the rear portion of the carriage 16, and further, the wiring substrate 22 electrically connected to the magnetic head 15 (See FIG. 1) on the H1 side is placed on the wiring substrate 21.

As shown in FIG. 2, at the rear end of the wiring substrates 21 and 22, connection land portions 21a and 22a are provided so as to be exposed on the carriage 16. Further, an adhesive double coated tape 26 is glued to the step portion 16a formed on the rear side of the wiring substrates 21 and 22.

When the main substrate 20 is installed at a position one step lower due to the step portion 16a, the lower surface of the reinforcing plate 24 (the thicker portion of the main substrate) is glued to the adhesive double coated tape 26 and secured in position. Further, the thin-film substrate 23 (the thinner portion of the main substrate) extends on the support surface 16c, and is superimposed on the wiring substrates 21 and 22. In this condition, the connection land portions 23a formed on the thin-film substrate 23 of the main substrate 20 are partly superimposed on the connection land portions 21a and 22a formed on the wiring substrates 21 and 22.

Then, as shown in FIG. 4. the outwardly exposed connection land portions 21a and 22a of the wiring substrates 21 and 22 are soldered to the connection land portions 23a of the main substrate 20 (the shaded portions) to establish electrical connection.

As described above, since only the thin-film substrate 23 of the main substrate 20 extends on the support surface 16c, the wiring substrates 21 and 22 and the portion of the main substrate 20 superimposed thereon are all thin, which means no step portion is generated. Further, since the wiring substrates 21 and 22 are first installed on the support surface 16c and then the thin-film substrate 23 extending from the main substrate 20 is superimposed on them, it is possible to reliably install the wiring substrates 21 and 22 on a flat surface (the carriage 16) by pressing them against it. Thus, there is no danger of the connection land portions 21a and 22a of the wiring substrates 21a and 22a led out from the magnetic head side rising due to warpage or the like.

Further, as shown in FIG. 3, it is desirable that the depth h1 of the step portion 16a be equal to the sum total of the thickness h3 of the reinforcing plate 24 of the main substrate 20 and the thickness of the adhesive double coated tape 26, whereby the surface of the reinforcing plate 24 can be made substantially flush with the support surface 16c when the reinforcing plate 24 is joined to the step portion 16a by the adhesive double coated tape (See FIG. 4), making it possible for the wiring substrates 21 and 22 and the thin-plate substrate 23 to be superimposed one upon the other on the support surface 16c without being bent.

Further, as shown in FIGS. 2 through 4, in the present invention, a protrusion 16b is integrally formed on or embedded in the support surface 16c as a positioning portion, and holes 21b and 22b (See FIG. 3) are formed in the portions of the wiring substrates 21 and 22 facing the protrusion 16b at the time of installation.

By passing the protrusion 16b through the holes 21b and 22b of the wiring substrates 21 and 22, the positioning of the wiring substrates 21 and 22 is effected on the support surface 16c of the carriage 16. Further, a cutout 20a is formed at the forward end of the main substrate 20 and the protrusion 16b is fitted into this cutout to thereby effect the positioning.

Due to this arrangement, It is possible to superimpose the connection land portions 21a and 22a and the connection land portion 23a of the main substrate one upon the other, with part of them being positioned appropriately.

The fitting connection with the protrusion 16b may be effected by forming holes in both the wiring substrates 21 and 22 and the main substrate 20. Further, it is also possible to form a groove in the support surface 16c as the positioning portion, fitting each substrate in this groove.

While the above embodiment has been described with reference to a magnetic head device mounted in a floppy disk apparatus, the present invention is also applicable to a magnetic head device having a wiring substrate which is electrically connected to the magnetic head and whose rear end is electrically connected to the main substrate, and more specifically, to a magnetic head device for use in a hard disk apparatus or the like. Or, it may also be an optical disk apparatus or a magneto-optical disk apparatus.

As described above, in accordance with the present invention, it is possible to prevent the connection and portions from rising on the relay member due to warpage of the wiring substrate or the like. Further, it is possible to reliably superimpose substrates having different thicknesses on each other and join them together. Further, by providing the relay member with a step portion and adhering and fastening the main substrate to the step portion, it is possible to fasten to the rely member the main substrate, which is the thicker substrate. Further, by providing a positioning portion, it is possible to perform the positioning of the joint portions of the substrates.

What is claimed is:

1. A substrate junction element comprising a main substrate having on its surface a wiring portion on which electronic parts are mounted and a connection land portion formed in its edge portion, a flexible wiring substrate having a connection land portion connected to the main substrate and a conductive lead electrically connected to the connection land portion and adapted to connect the electronic parts to another electronic function portion, and a relay member having a support surface supporting the connection portion of the main substrate and the wiring substrate, wherein the wiring substrate is placed on the support surface, wherein the main substrate is placed such that the connection land portion of the main substrate is adjacent to the wiring substrate, and wherein the connection land portion of the wiring substrate and the connection land portion of the main substrate are soldered to each other.

2. A substrate junction element according to claim 1, wherein there is formed on the support surface a positioning portion adapted to be fitted into the wiring substrate to effect the positioning thereof.

3. A substrate junction element according to claim 1, wherein there are provided a plurality of said wiring substrates, wherein the positioning of each wiring substrate is effected by the positioning portion which is common to them, and wherein the main substrate is placed on the plurality of wiring substrates.

4. A substrate junction element according to claim 1, wherein the main substrate consists of a laminate composed of a thin-film substrate on which electronic parts are mounted and which has a connection land portion and a reinforcing plate supporting the thin-film substrate, wherein the thin-film substrate protrudes beyond the edge portion of the reinforcing plate, and wherein the protruding portion of the thin-film substrate is placed on the wiring substrate on the support plate.

5. A substrate junction element according to claim 4, wherein the relay member is provided with a step portion forming a portion lower than the support surface, wherein the portion of the main substrate having the reinforcing plate is positioned on the lower portion, and wherein the portion of the thin-film substrate protruding beyond the edge portion of the reinforcing plate is placed on the support surface.

6. A substrate junction element according to claim 5, wherein the reinforcing plate and the relay member are fastened to each other by adhesion in said lower portion.

7. A substrate junction element according to claim 1, wherein the relay member is a carriage to which the base end of the support member supporting a magnetic head is fastened, wherein a circuit for recording or reproduction is mounted on the main substrate, and wherein the wiring substrate connects the electronic parts on the main substrate and the magnetic head serving as the electronic function portion to each other.

* * * * *